(12) United States Patent
Carey et al.

(10) Patent No.: US 8,154,829 B2
(45) Date of Patent: Apr. 10, 2012

(54) TUNNELING MAGNETORESISTIVE (TMR) DEVICE WITH IMPROVED FERROMAGNETIC UNDERLAYER FOR MGO TUNNELING BARRIER LAYER

(75) Inventors: Matthew J. Carey, San Jose, CA (US); Jeffrey R. Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 408 days.

(21) Appl. No.: 12/553,864

(22) Filed: Sep. 3, 2009

(65) Prior Publication Data

US 2009/0323228 A1    Dec. 31, 2009

Related U.S. Application Data

(63) Continuation-in-part of application No. 11/781,576, filed on Jul. 23, 2007, now Pat. No. 7,826,182.

(51) Int. Cl.
    *G11B 5/127*    (2006.01)
(52) U.S. Cl. .................................. 360/324.2
(58) Field of Classification Search ............... 360/324.2
    See application file for complete search history.

(56) References Cited

U.S. PATENT DOCUMENTS

| | | | |
|---|---|---|---|
| 6,905,780 B2 | 6/2005 | Yuasa et al. | |
| 7,813,088 B2 * | 10/2010 | Tsunekawa et al. | ..... 360/324.12 |
| 7,916,433 B2 * | 3/2011 | Huai et al. | ............... 360/324.12 |
| 7,978,443 B2 * | 7/2011 | Miura et al. | ............... 360/324.2 |
| 7,999,336 B2 * | 8/2011 | Wang et al. | ................... 257/421 |
| 8,049,997 B2 * | 11/2011 | Miyauchi et al. | ............. 360/319 |
| 2005/0073778 A1 | 4/2005 | Hasegawa et al. | |
| 2006/0044705 A1 | 3/2006 | Hasegawa et al. | |
| 2006/0067017 A1 | 3/2006 | Yuasa et al. | |
| 2008/0198514 A1 | 8/2008 | Jogo et al. | |
| 2009/0257151 A1* | 10/2009 | Zhang et al. | ............... 360/324.2 |

OTHER PUBLICATIONS

Maat et al., "Current perpendicular to the plane spin-valves with CoFeGe magnetic layers", Appl. Phys. Lett. 93, 143505 (2008), Published Oct. 10, 2008.

* cited by examiner

*Primary Examiner* — Mark Blouin
(74) *Attorney, Agent, or Firm* — Thomas R. Berthold

(57) ABSTRACT

A tunneling magnetoresistance (TMR) device, like a TMR read head for a magnetic recording hard disk drive, has a magnesium oxide (MgO) tunneling barrier layer and a ferromagnetic underlayer beneath and in direct contact with the MgO tunneling barrier layer. The ferromagnetic underlayer comprises a crystalline material according to the formula $(Co_xFe_{(100-x)})_{(100-y)}Ge_y$, where the subscripts represent atomic percent, x is between about 45 and 55, and y is between about 26 and 37. The ferromagnetic underlayer may be the $(Co_xFe_{(100-x)})_{(100-y)}Ge_y$ portion of a bilayer of two ferromagnetic layers, for example a $CoFe/(Co_xFe_{(100-x)})_{(100-y)}Ge_y$ bilayer. The specific composition of the ferromagnetic underlayer improves the crystallinity of the MgO tunneling barrier after annealing and improves the tunneling magnetoresistance of the TMR device.

14 Claims, 4 Drawing Sheets

TUNNELING MAGNETORESISTIVE (TMR) DEVICE WITH IMPROVED FERROMAGNETIC UNDERLAYER FOR MGO TUNNELING BARRIER LAYER

RELATED APPLICATION

This application is a continuation-in-part of application Ser. No. 11/781,576 filed Jul. 23, 2007.

BACKGROUND OF THE INVENTION

1. Field of the Invention

The invention relates generally to tunneling magnetoresistance (TMR) devices, and more particularly to a TMR read head with a magnesium oxide (MgO) tunneling barrier layer.

2. Description of the Related Art

A tunneling magnetoresistance (TMR) device, also called a magnetic tunneling junction (MTJ) device, is comprised of two ferromagnetic layers separated by a thin insulating tunneling barrier layer. The barrier layer is typically made of a metallic oxide that is so sufficiently thin that quantum-mechanical tunneling of charge carriers occurs between the two ferromagnetic layers. While various metallic oxides, such as alumina ($Al_2O_3$) and titanium oxide ($TiO_2$), have been proposed as the tunneling barrier material, the most promising material is crystalline magnesium oxide (MgO). The quantum-mechanical tunneling process is electron spin dependent, which means that an electrical resistance measured when applying a sense current across the junction depends on the spin-dependent electronic properties of the ferromagnetic and barrier layers, and is a function of the relative orientation of the magnetizations of the two ferromagnetic layers. The magnetization of the first ferromagnetic layer is designed to be pinned, while the magnetization of the second ferromagnetic layer is designed to be free to rotate in response to external magnetic fields. The relative orientation of their magnetizations varies with the external magnetic field, thus resulting in change in the electrical resistance. The TMR device is usable as a memory cell in a nonvolatile magnetic random access memory (MRAM) array, as described in U.S. Pat. No. 5,640,343, and as TMR read head in a magnetic recording disk drive, as described in U.S. Pat. No. 5,729,410.

FIG. 1 illustrates a cross-sectional view of a conventional TMR read head 10. The TMR read head 10 includes a bottom "fixed" or "pinned" ferromagnetic (FM) layer 18, an insulating tunneling barrier layer 20, and a top "free" FM layer 32. The TMR read head 10 has bottom and top nonmagnetic electrodes or leads 12, 14, respectively, with the bottom nonmagnetic electrode 12 being formed on a suitable substrate. The FM layer 18 is called the "pinned" layer because its magnetization is prevented from rotation in the presence of an applied magnetic field in the desired range of interest for the TMR device, i.e., the magnetic field from a recorded region of the magnetic layer in a magnetic recording disk. The magnetization of the pinned FM layer 18 can be fixed or pinned by being formed of a high-coercivity film or by being exchange-coupled to an antiferromagnetic (AF) "pinning" layer. The pinned FM layer 18 may be replaced by an antiparallel (AP) pinned or flux-closure structure, where two ferromagnetic layers are separated by an antiparallel coupling (APC) spacer layer and thus antiparallel-coupled to form a flux closure, as described in U.S. Pat. No. 5,465,185. The magnetization of the free FM layer 32 is free to rotate in the presence of the applied magnetic field in the range of interest. In the absence of the applied magnetic field, the magnetizations of the FM layers 18 and 32 are aligned generally perpendicular in the TMR read head 10. The relative orientation of the magnetizations of the FM layers 18, 32 determines the electrical resistance of the TMR device.

It is known from published reports of theoretical calculations that TMR devices with MgO tunneling barriers, specifically Fe/MgO/Fe, CoFe/MgO/CoFe, and Co/MgO/Co tunnel junctions, should exhibit a very large magnetoresistance due to coherent tunneling of the electrons of certain symmetry. However, these calculations are based on MgO tunnel junctions having (001) epitaxy and perfect crystallinity. For CoFe/MgO/CoFe tunnel junctions it is known that magnetoresistance is low due to inferior crystallinity of the MgO barrier. However, it has been found that when amorphous CoFeB layers are used in place of crystalline CoFe layers in the junctions, higher magnetoresistance was observed after annealing. The amorphous CoFeB is known to promote high quality crystallization of the MgO into the (001) direction. However, CoFeB is an alloy with relatively low spin-polarization, whereas high spin-polarization is desirable for higher magnetoresistance in a TMR device.

What is needed is a TMR read head with high tunneling magnetoresistance and a high quality crystallization of the MgO tunneling barrier.

SUMMARY OF THE INVENTION

The invention relates to a TMR device with an MgO tunneling barrier layer. The ferromagnetic underlayer beneath and in direct contact with the MgO tunneling barrier layer comprises a crystalline material according to the formula $(Co_xFe_{(100-x)})_{(100-y)}Ge_y$, where the subscripts represent atomic percent, x is between about 45 and 55, and y is between about 26 and 37. The ferromagnetic underlayer may be part of a simple pinned structure or the reference layer of an AP-pinned structure if the TMR device is a bottom-pinned device, or part of the free ferromagnetic layer if the simple pinned structure (or the AP-pinned structure) is located on top of the MgO tunneling barrier layer. The ferromagnetic underlayer may be the $Co_xFe_{(100-x)})_{(100-y)}Ge_y$ portion of a bilayer of two ferromagnetic layers, for example a $CoFe/(Co_xFe_{(100-x)})_{(100-y)}Ge_y$ bilayer. The specific composition of the ferromagnetic underlayer improves the crystallinity of the MgO tunneling barrier after annealing and improves the tunneling magnetoresistance of the TMR device.

For a fuller understanding of the nature and advantages of the present invention, reference should be made to the following detailed description taken together with the accompanying figures.

DETAILED DESCRIPTION OF THE INVENTION

Figure 1:
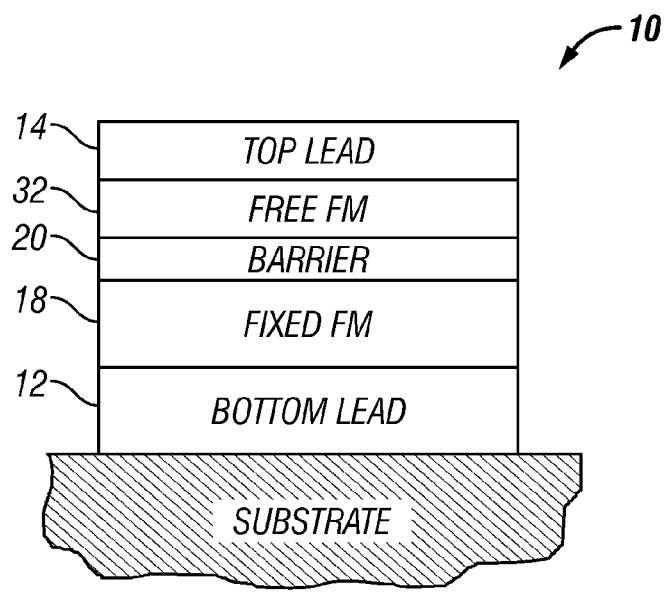
FIG. 1 is a cross-sectional view illustrating the structure of a conventional tunneling magnetoresistive (TMR) read head.
Figure 2:
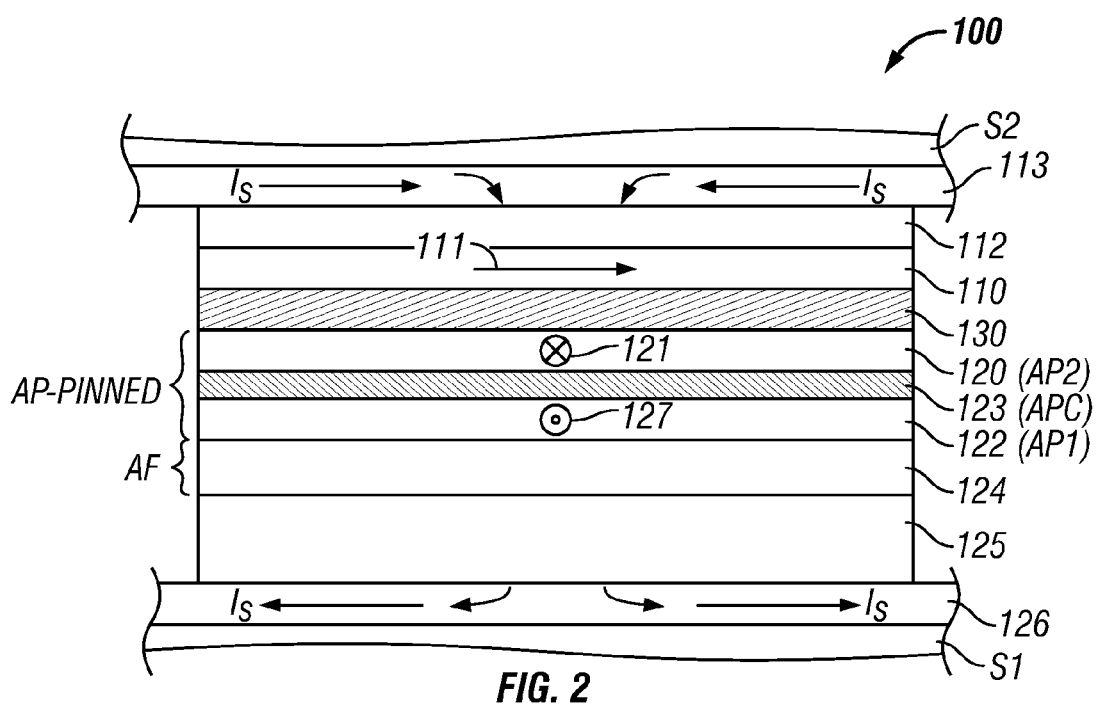
FIG. 2 is a cross-sectional view illustrating the detailed structure of a prior-art TMR read head.

FIG. 2 is a cross-sectional view illustrating the structure of a prior-art TMR read head 100 like that used in a magnetic recording disk drive. This cross-sectional view is a view of what is commonly referred to as the air-bearing surface (ABS) of the TMR read head 100. The TMR read head 100 includes a sensor stack of layers formed between two ferromagnetic shield layers S1, S2 that are typically made of electroplated NiFe alloy films. The lower shield S1 is typically smoothened by chemical-mechanical polishing (CMP) to provide a smooth surface for the growth of the sensor stack. The sensor stack includes a ferromagnetic reference layer 120 having a pinned magnetization 121 oriented transversely (away from the page), a ferromagnetic free layer 110 having a magnetization 111 that can rotate in the plane of layer 110 in response to transverse external magnetic fields from a recording disk, and an electrically insulating tunneling barrier layer 130, typically magnesium oxide (MgO), between the ferromagnetic reference layer 120 and ferromagnetic free layer 110.

The reference layer 120 may be a conventional "simple" or single pinned layer that has its magnetization direction 121 pinned or fixed, typically by being exchange coupled to an antiferromagnetic layer. However, in the example of FIG. 2, the reference layer 120 is part of the well-known antiparallel (AP) pinned or flux-closure structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower or "keeper" ferromagnetic (AP1) layer 122 that are antiferromagnetically coupled across an AP coupling (APC) layer 123, such as Ru, Ir, Rh, or Cr, or alloys thereof. Due to the antiparallel coupling across the APC layer 123, the reference (AP2) and keeper (AP1) ferromagnetic layers 120, 122 have their respective magnetizations 121, 127 oriented antiparallel to each other. As a result, the net magnetization of the AP2 and AP1 ferromagnetic layers 120, 122 is so small that a demagnetizing field induced by the flux closure structure in the ferromagnetic free layer 110 is substantially minimized, and thus it becomes feasible for the TMR read head to operate optimally.

Located between the lower shield layer S1 and the AP-pinned structure are seed layer 125 and an antiferromagnetic (AF) pinning layer 124. The seed layer 125 facilitates the AF pinning layer 124 to grow a microstructure with a strong crystalline texture and thus develop strong antiferromagnetism. The seed layer 125 may be a single layer or multiple layers of different materials. The AF pinning layer 124 thus strongly exchange-couples to the ferromagnetic keeper layer 122, and thereby rigidly pins the magnetization 127 of the ferromagnetic keeper layer 122 in a direction perpendicular to and away from the ABS. The antiparallel coupling across the APC layer 123 then subsequently rigidly pins the magnetization 121 of the ferromagnetic reference layer 120 in a direction perpendicular to and towards the ABS, and antiparallel to magnetization 127. As a result, the net magnetization of the ferromagnetic AP2 and AP1 layers 120, 122 is rigidly pinned, and thus the optimal operation of the TMR read head is ensured. Instead of being pinned by an AF layer, the AP1 layer 122 may by itself be a hard magnetic layer or have its magnetization 127 pinned by a hard magnetic layer such as $Co_{100-x}Pt_x$ or $Co_{100-x-y}Pt_xCr_y$ (where x is between about 8 and 30 atomic percent). The AP-pinned structure may also be "self-pinned". In a "self pinned" sensor the AP1 and AP2 layer magnetization directions 127, 121 are typically set generally perpendicular to the disk surface by magnetostriction and the residual stress that exists within the fabricated sensor.

Located between the ferromagnetic free layer 110 and the upper shield layer S2 is a layer 112, sometimes called a capping or cap layer. The layer 112 protects the ferromagnetic free layer 110 from chemical and mechanical damages during processing, so that ferromagnetic free layer 110 maintains good ferromagnetic properties.

In the presence of external magnetic fields in the range of interest, i.e., magnetic fields from written data on the recording disk, while the net magnetization of the ferromagnetic layers 120, 122 remains rigidly pinned, the magnetization 111 of the ferromagnetic free layer 110 will rotate in responses to the magnetic fields. Thus when a sense current $I_S$ flows from the upper shield layer S2 perpendicularly through the sensor stack to the lower shield layer S1, the magnetization rotation of the ferromagnetic free layer 111 will lead to the variation of the angle between the magnetizations of the ferromagnetic reference layer 120 and the ferromagnetic free layer 110, which is detectable as the change in electrical resistance.

Because the sense current is directed perpendicularly through the stack of layers between the two shields S1 and S2, the TMR read head 100 is a current-perpendicular-to-the-plane (CPP) read head. Another type of CPP read head is the well-known giant magnetoresistance (GMR) spin-valve read head, which does not use an electrically insulating tunneling barrier layer between the free and pinned ferromagnetic layers, but instead uses an electrically conducting spacer layer, which is typically formed of Cu.

FIG. 2 also shows optional separate electrical leads 126, 113 between shields S1, S2, respectively, and the sensor stack. Leads 126, 113 may be formed of Ta, Ti, Ru, Rh or a multilayer thereof. The leads are optional and may be used to adjust the shield-to-shield spacing. If the leads 126 and 113 are not present, the bottom and top shields S1 and S2 are used as electrical leads. The ferromagnetic keeper, reference and free layers 122, 120, and 110 are typically formed of a CoFe, CoFeB or NiFe film, or formed of multiple layers comprising these films. The seed layer 125 is typically formed of multiple layers comprising Ta/NiFeCr/NiFe, Ta/NiFe, Ta/Ru or Ta/Cu films. The AFM pinning layer 124 is typically made of an FeMn, NiMn, PtMn, IrMn, PdMn, PtPdMn or RhMn film. The cap layer 112 is typically made of Ru, Rh, Ti, Ta or a multilayer thereof.

While the TMR read head 100 shown in FIG. 2 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the barrier layer 130.

It is known from published reports of theoretical calculations that TMR devices with MgO tunneling barriers, specifically Fe/MgO/Fe, CoFe/MgO/CoFe, and Co/MgO/Co tunnel junctions, should exhibit a very large magnetoresistance due to coherent tunneling of the electrons of certain symmetry. However, these calculations are based on MgO tunnel junctions having (001) epitaxy and perfect crystallinity. For CoFe/MgO/CoFe tunnel junctions it is known that magnetoresistance is low due to inferior crystallinity of the MgO barrier. However, it has been found that when amorphous CoFeB layers are used in place of crystalline CoFe layers in the junctions, higher magnetoresistance was observed after annealing. The amorphous CoFeB is known to promote high quality crystallization of the MgO into the (001) direction. However, CoFeB is an alloy with relatively low spin-polarization, whereas high spin-polarization is desirable for higher magnetoresistance in a TMR read head.

In this invention the tunneling barrier layer 130 is MgO and the ferromagnetic underlayer beneath and in direct contact with the MgO tunneling barrier layer 130 is a crystalline material according to the formula $(Co_xFe_{(100-x)})_{(100-y)}Ge_y$, where the subscripts represent atomic percent, x is between about 45 and 55, and y is between about 26 and 37. The ferromagnetic underlayer may be part of a simple pinned structure or part of the reference layer of an AP-pinned structure if the TMR read head is a bottom-pinned read head or the free ferromagnetic layer if the simple pinned structure (or the AP-pinned structure) is located on top of the MgO tunneling barrier layer 130. In a simple pinned structure the pinned layer may be a bilayer of CoFe/$(Co_xFe_{(100-x)})_{(100-y)}Ge_y$ with the CoFe layer being in contact with the AF pinning layer, e.g., IrMn. The AP-pinned structure may be a structure like IrMn/CoFe/Ru/CoFe/CoFeGe, where the AP2 or reference layer 120 is a bilayer of CoFe/$(Co_xFe_{(100-x)})_{(100-y)}Ge_y$ with the CoFe layer being in contact with the APC layer 123. The specific composition of the ferromagnetic underlayer improves the crystallinity of the MgO tunneling barrier after annealing and improves the tunneling magnetoresistance of the TMR read head.

The above-cited parent application describes a $(Co_xFe_{(100-x)})_{(100-y)}Ge_y$ alloy with specific ranges of Co/Fe ratio and atomic percent Ge for use as free and pinned ferromagnetic layers in CPP GMR spin-valve read heads.

The addition of Ge to ferromagnetic layers in CPP-SV sensors has been previously suggested. For example, in US 2006/0044705 A1 a CPP sensor is described wherein at least one of the free and pinned ferromagnetic layers has the composition $(Cu_{0.67}Fe_{0.33})_{100-a}Z_a$, wherein Z may represent at least one element selected from the group consisting of Al, Ga, Si, Ge, Sn, and Sb, and the parameter "a" is less than or equal to 30 in terms of atomic percent. However, in the present invention it has been discovered that a substantial increase in magnetoresistance occurs in $(Co_xFe_{1-x})_{75}Ge_{25}$ alloys if the Co/Fe ratio is close to 1.0, preferably between about 0.8 and 1.2. This is shown in FIG. 3, wherein the Co fraction in the CoFe of the CoFeGe alloy was varied for a CPP structure with a AP-pinned layer and an antiparallel-coupled free (APF) layer according to the following:

[AP1=30 Å CoFe35]/8 Å Ru/[AP2=3 Å CoFe50/30 Å (CoFe) Ge25/5 Å CoFe50]
[SPACER=40 Å Cu]
[APF1=5 Å CoFe50/(60 Å (CoFe)Ge25/3 Å CoFe50]/8 Å Ru/[APF2=3 Å CoFe10/35 Å NiFe]

Figure 3:
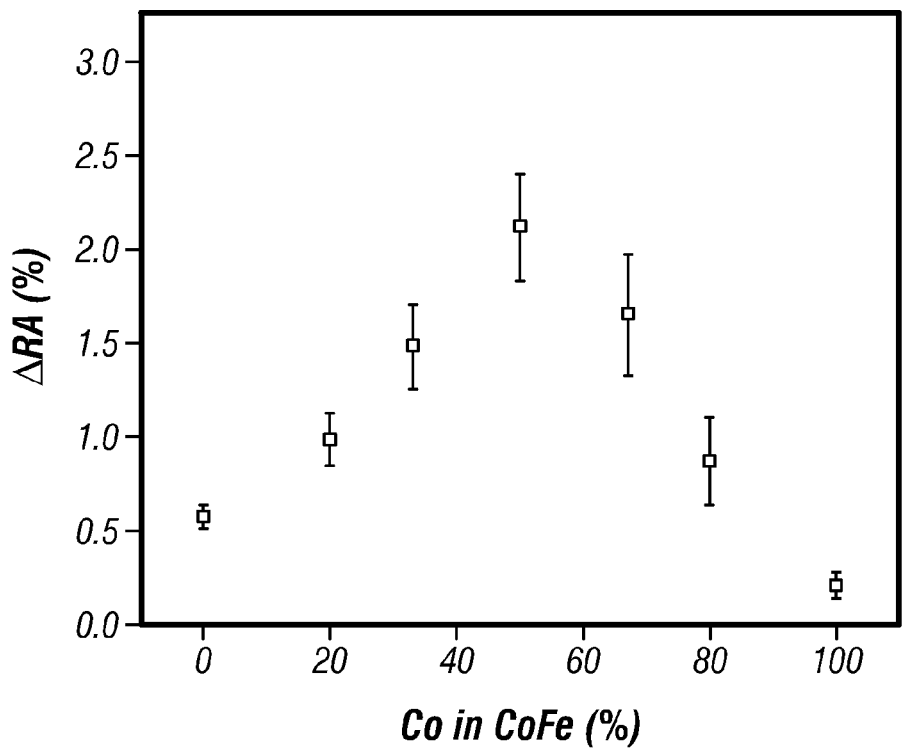
FIG. 3 is a graph of magnetoresistance as a function of Co fraction in the CoFe portion of the CoFeGe alloy for a CPP GMR structure wherein the CoFeGe alloy is present in both the pinned and free layers.

As shown by FIG. 3, a substantial increase in magnetoresistance ($\Delta R/R$) occurs for a Co/Fe ratio of 1.0 (i.e., the CoFe in the $(Co_xFe_{1-x})_{75}Ge_{25}$ alloy has the composition $Co_{50}Fe_{50}$, where the subscripts are atomic percent). However, this precise ratio is not required, and as long as the ratio is between about 0.8 and 1.2, corresponding approximately to a composition of $Co_xFe_{(100-x)}$ where x is between about 45 and 55, there is still an optimized magnetoresistance. The final Co/Fe ratio may be chosen to satisfy other magnetic properties such as coercivity and anisotropy.

The CoFeGe alloy, like the conventional CoFe, is crystalline. This has been determined experimentally using X-ray diffraction analysis of $(Co_{50}Fe_{50})_{(100-y)}Ge_y$ films with y between 7 and 40. In all cases the diffraction pattern showed a peak corresponding to the (110), (202), and (211) planes after annealing at 245° C. for 5 hours. These annealing conditions are typical to initialize pinning with an antiferromagnet such as PtMn or IrMn in a spin-valve structure.

Figure 4:
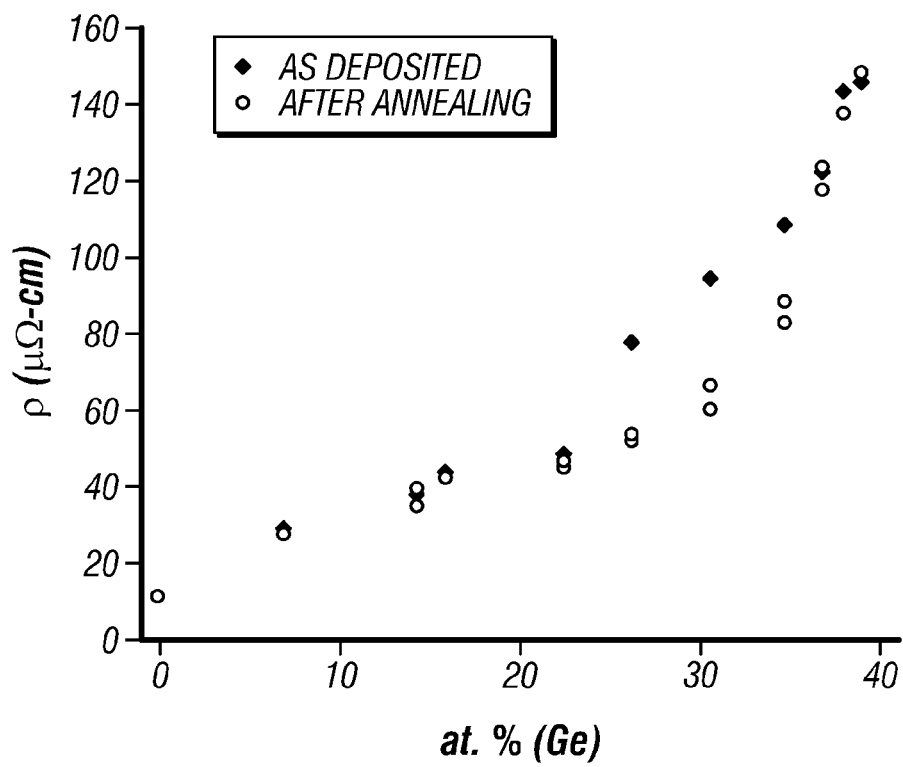
FIG. 4 is a graph of resistivity p as a function of atomic percent (at. %) Ge in a $[Co_{50}Fe_{50}]_{(100-y)}Ge_y$ alloy.

The addition of Ge increases the electrical resistivity of the ferromagnetic material, which is indicative of a shortening of the SDL. For crystalline $Co_{50}Fe_{50}$ $\rho$ is approximately 10.6 $\mu\Omega$cm. FIG. 4 is a graph of $\rho$ as a function of atomic percent (at. %) Ge in a $[Co_{50}Fe_{50}]_{(100-y)}Ge_y$ alloy. The resistivity is significantly greater than for the CoFe alloy without Ge, and increases from about 40 to about 90 $\mu\Omega$cm as the Ge is increased from about 20 to about 35 at. %.

Figure 5:
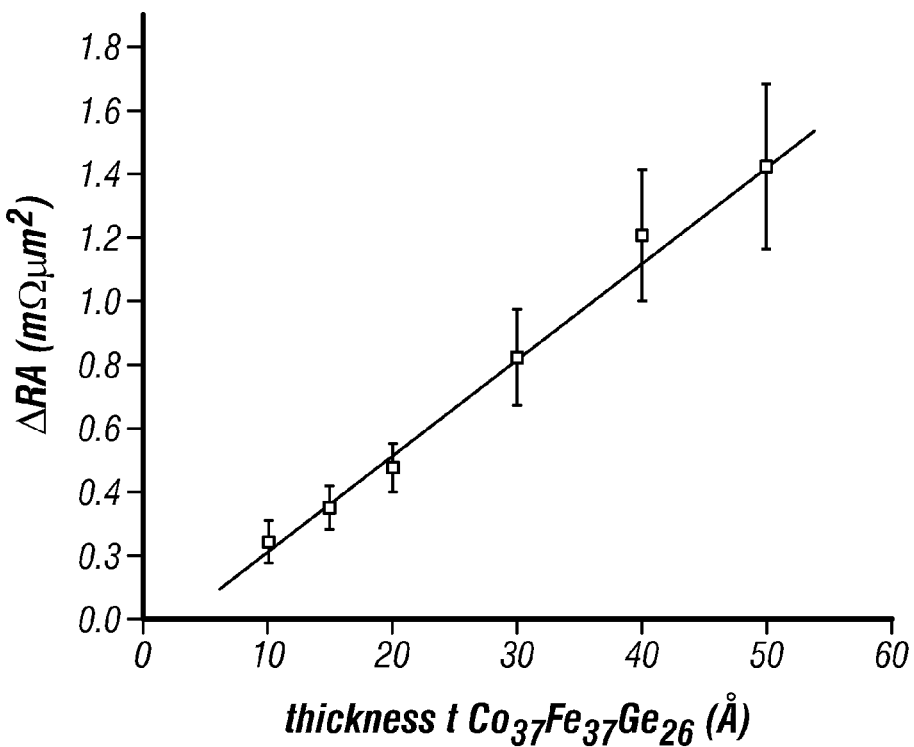
FIG. 5 is a graph of change in resistance-area product (ARA) versus thickness of a $(Co_{50}Fe_{50})_{74}Ge_{26}$ alloy used to calculate the bulk scattering parameter β.

The addition of Ge also significantly improves the bulk electron scattering parameter $\beta$ above that for just crystalline CoFe alloy. Preferably $\beta$ is 0.3 or higher at room temperature. By way of comparison, crystalline $Co_{90}Fe_{10}$ has a $\beta$ of about 0.40-0.45 at room temperature. FIG. 5 is a graph of resistance-area product ($\Delta RA$) versus thickness of a $(Co_{50}Fe_{50})_{74}Ge_{26}$ alloy free layer in a underlayer/IrMn/$CoFe_{50}$(30 Å)/Ru(8 Å)/$CoFe_{50}$(30 Å)/Cu(35 Å)/$(Co_{50}Fe_{50})_{74}Ge_{26}$ ($t_F$)/cap spin-valve. Clearly $\Delta RA$ increases about linearly over the thickness range investigated. Thus the $(Co_{50}Fe_{50})_{74}Ge_{26}$ spin-diffusion length is greater than 60 Å and the parallel resistor network model can be employed to describe the spin-transport for present spin-valves. Assuming total spin-memory loss in the Ru AP coupling layer and using the fact that most of the resistance of the spin-valve is parasitic, i.e. it originates from the antiferromagnet and other layers not contributing to the signal, $\beta$ can be calculated from present spin-valve data as $$\frac{\partial(RA)_{AP}}{\partial t_f} = \frac{\rho_f}{1-\beta^2},$$

where $(RA)_{AP}$ is the resistance-area product when the reference and free layers are in the antiparallel state, $t_f$ is the thickness of the free layer, and $\rho_f$ is the resistivity of the $(Co_{50}Fe_{50})_{74}Ge_{26}$ free layer as determined from sheet resistance measurements. From the above relation it can be determined that $\beta$=0.77, which is significantly higher than for a CoFe alloy without Ge.

Figure 6:
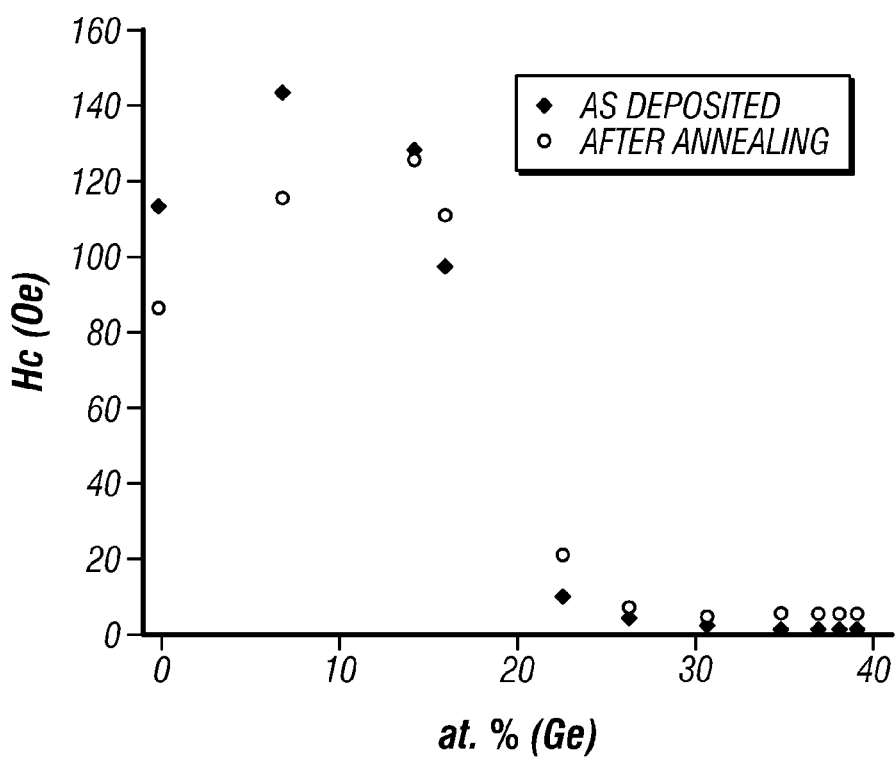
FIG. 6 is a graph of coercivity Hc as a function of atomic percent (at. %) Ge in a $(Co_{50}Fe_{50})_{(100-y)}Ge_y$ alloy.
Figure 7:
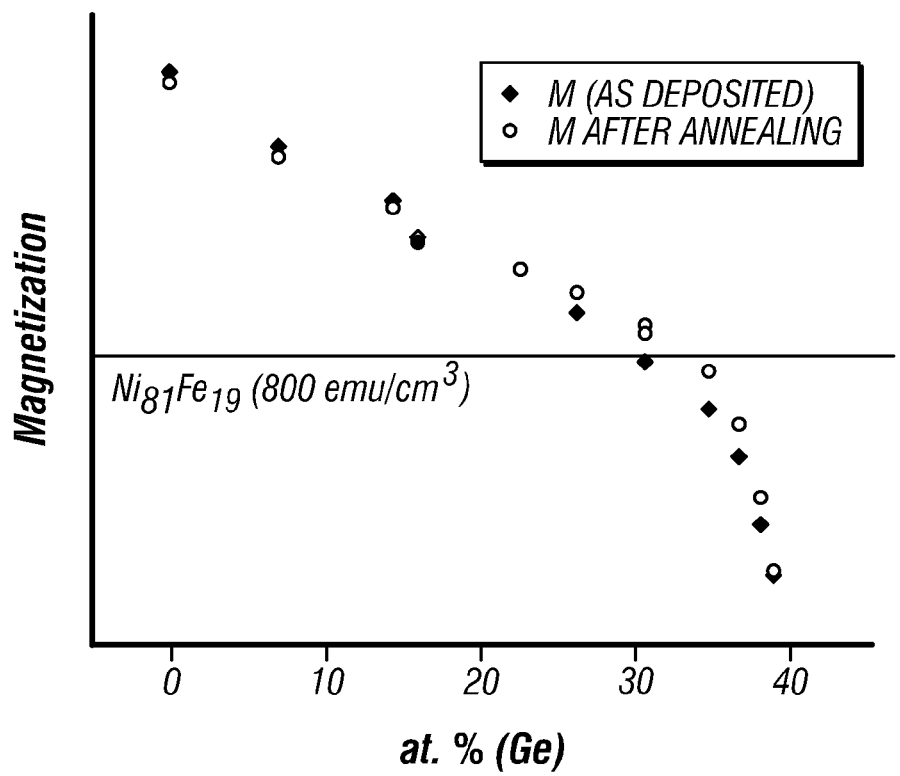
FIG. 7 is a graph of magnetization M in units of emu/cm$^2$ as a function of atomic percent (at. %) Ge in a $(Co_{50}Fe_{50})_{(100-y)}Ge_y$ alloy.

In addition to the requirement that the Co/Fe ratio be between about 0.8 and 1.2, the Ge must be present in an amount between about 20 to 40 atomic percent, preferably between about 23 to 37 atomic percent. This is shown by FIGS. 6 and 7. FIG. 6 is a graph of coercivity Hc as a function of atomic percent (at. %) Ge in a $(Co_{50}Fe_{50})_{(100-y)}Ge_y$ alloy. Hc drops sharply for Ge around 23 at. % and remains low for increasing amounts of Ge. $(Co_{50}Fe_{50})_{(100-y)}Ge_y$ hysteresis loops with Ge content of 23 at % and higher also exhibit a squareness close to 1. The low coercivity and high squareness of the hysteresis loops indicate high exchange interaction and low anisotropy. Low Hc and anisotropy are required for free layers. FIG. 7 is a graph of magnetization M in units of emu/cm$^3$ as a function of atomic percent (at. %) Ge in a $(Co_{50}Fe_{50})_{(100-y)}Ge_y$ alloy. The horizontal line represents the value of M=800 emu/cm$^3$ for a conventional $Ni_{81}Fe_{19}$ alloy used in free layers. The magnetization drops with increasing Ge content. Ge content above about 37 at. % renders the alloy unacceptable because the layers would have to be deposited too thick to get adequate moment. Thus the preferred range of Ge content is between about 23 and 37 at. % for a $(Co_{50}Fe_{50})_{(100-y)}Ge_y$ alloy, but may be a somewhat wider range of between about 20 and 40 at. % if the CoFe portion of the alloy is closer to $Co_{45}Fe_{55}$ or $Co_{55}Fe_{45}$.

Figure 8:
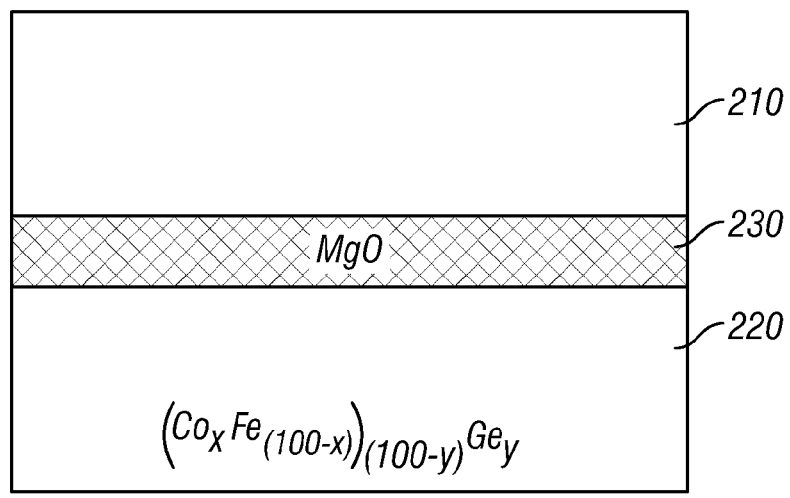
FIG. 8 is a cross-sectional view of the tunnel junction portion of a TMR read head according to this invention.

FIG. 8 is a sectional view illustrating just the tunnel junction portion of the TMR read head with the $(Co_xFe_{(100-x)})_{(100-y)}Ge_y$ alloy according to this invention. The ferromagnetic layer 220, which is the $(Co_xFe_{(100-x)})_{(100-y)}Ge_y$ portion of a simple pinned structure or the $(Co_xFe_{(100-x)})_{(100-y)}Ge_y$ portion of the reference (AP2) layer of an AP-pinned structure, and the free ferromagnetic layer 210 are located on opposite surfaces of the MgO tunneling barrier 230. The free ferromagnetic layer 210 is preferably a CoFe or CoFeB layer, or a CoFe/CoFeB bilayer. The ferromagnetic layer 220 is the underlayer directly in contact with the MgO barrier 230. FIG. 8 thus shows a bottom-pinned embodiment of the TMR read head. However the free ferromagnetic layer 210 may be the underlayer in direct contact with the MgO barrier layer, with the ferromagnetic layer 220 (which may be the AP2 layer of an AP-pinned structure) on top of the MgO barrier 230. The ferromagnetic layer 220 in direct contact with the MgO barrier 230 is formed of the crystalline material according to the formula $(Co_xFe_{(100-x)})_{(100-y)}Ge_y$, where the subscripts represent atomic percent, x is between about 45 and 55, and y is between about 26 and 37. The Ge range of 26 to 37 atomic percent assures the proper coercivity and magnetization of the ferromagnetic underlayer, as shown by FIGS. 6 and 7. The ferromagnetic layer 220 may be the $(Co_xFe_{(100-x)})_{(100-y)}Ge_y$ portion of a bilayer of two ferromagnetic layers, for example a CoFe/$(Co_xFe_{(100-x)})_{(100-y)}Ge_y$ bilayer.

A conventional free ferromagnetic layer in a TMR read head typically has a magnetic moment equivalent to a $Ni_{80}Fe_{20}$ layer with a thickness between about 40 to 90 Å. Thus if the ferromagnetic underlayer is the ferromagnetic layer 210 it should have approximately this value of magnetic moment/area. $(Co_{50}Fe_{50})_{(100-y)}Ge_y$, where y is between 10 and 30 atomic percent, has a magnetic moment of about 1300 to 750 $emu/cm^3$, respectively.

The TMR read head with the tunnel junction described above and shown in FIG. 8 is fabricated in the conventional manner, wherein the layers in the sensor stack are deposited by sputter deposition or other known thin-film disposition techniques, after which the stack is lithographically patterned and etched to define the desired dimensions for the read head. The structure is then annealed in the presence of an applied magnetic field to set the direction of the magnetization of the pinned ferromagnetic layer. The annealing is typically done at 240 to 280° C. for about 3 to 5 hours. The annealing may also improve the crystallinity of the stack yielding higher TMR.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A tunneling magnetoresistive (TMR) device comprising:
    a substrate;
    a first ferromagnetic layer on the substrate and having a composition according to the formula $(Co_xFe_{(100-x)})_{(100-y)}Ge_y$, where x is between 45 and 55 atomic percent, and y is between 26 and 37 atomic percent;
    a tunneling barrier layer consisting essentially of MgO directly on and in contact with the first ferromagnetic layer; and
    a second ferromagnetic layer on the tunneling barrier layer.

2. The device of claim 1 wherein the first ferromagnetic is a free ferromagnetic layer having an in-plane magnetization direction substantially free to rotate in the presence of an external magnetic field layer, and the second ferromagnetic layer is part of a pinned layer structure having an in-plane magnetization direction substantially prevented from rotation in the presence of an external magnetic field.

3. The device of claim 1 wherein the first ferromagnetic layer is part of a pinned layer structure having an in-plane magnetization direction substantially prevented from rotation in the presence of an external magnetic field, and the second ferromagnetic layer is a free ferromagnetic layer having an in-plane magnetization direction substantially free to rotate in the presence of an external magnetic field.

4. The device of claim 3 wherein the pinned layer structure is an antiparallel (AP) pinned structure comprising a first AP-pinned (AP1) ferromagnetic layer having an in-plane magnetization direction, a second AP-pinned (AP2) ferromagnetic layer adjacent the tunneling barrier layer and having an in-plane magnetization direction substantially antiparallel to the magnetization direction of the AP1 layer, and an AP coupling (APC) layer between and in contact with the AP1 and AP2 layers.

5. The device of claim 4 wherein the AP-pinned structure is a self-pinned structure.

6. The device of claim 4 further comprising an antiferromagnetic layer exchange-coupled to the AP1 layer for pinning the magnetization direction of the AP1 layer.

7. The device of claim 4 further comprising a hard magnetic layer in contact with the AP1 layer for pinning the magnetization direction of the AP1 layer.

8. The device of claim 3 wherein the pinned structure is a simple pinned structure comprising an antiferromagnetic pinning layer, a ferromagnetic layer consisting essentially of Co and Fe in contact with the antiferromagnetic pinning layer, and wherein said first ferromagnetic layer is in contact with said ferromagnetic CoFe layer.

9. The device of claim 1 wherein the device is a magnetoresistive read head for reading magnetically recorded data from tracks on a magnetic recording medium, and wherein the substrate is a first shield formed of magnetically permeable material.

10. A tunneling magnetoresistive (TMR) read head comprising:
    a first shield layer of magnetically permeable material;
    an antiparallel (AP) pinned structure comprising a first AP-pinned (AP1) ferromagnetic layer on the first shield layer and having an in-plane magnetization direction, a second AP-pinned (AP2) ferromagnetic layer having an in-plane magnetization direction substantially antiparallel to the magnetization direction of the AP1 layer and comprising a layer of $(Co_xFe_{(100-x)})_{(100-y)}Ge_y$, where x is between 45 and 55 atomic percent and y is between 26 and 37 atomic percent, and an AP coupling (APC) layer between and in contact with the AP1 and AP2 layers;
    an electrically insulating tunneling barrier layer consisting essentially of MgO on and in contact with the $(Co_xFe_{(100-x)})_{(100-y)}Ge_y$ layer;
    a free ferromagnetic layer on the tunneling barrier layer, the free ferromagnetic layer having an in-plane magnetization direction oriented substantially orthogonal to the magnetization directions of the AP1 and AP2 layers in the absence of an external magnetic field;
    a capping layer on the free ferromagnetic layer; and
    a second shield layer of magnetically permeable material on the capping layer.

11. The read head of claim 10 wherein the AP2 layer comprises a ferromagnetic layer consisting essentially of Co and Fe between the APC layer and the $(Co_xFe_{(100-x)})_{(100-y)}Ge_y$ layer.

12. The read head of claim 10 wherein the AP-pinned structure is a self-pinned structure.

13. The read head of claim 10 further comprising an anti-ferromagnetic layer exchange-coupled to the AP1 layer for pinning the magnetization direction of the AP1 layer.

14. The read head of claim 10 further comprising a hard magnetic layer in contact with the AP1 layer for pinning the magnetization direction of the AP1 layer.

* * * * *